United States Patent
Ko et al.

(10) Patent No.: US 8,664,833 B2
(45) Date of Patent: Mar. 4, 2014

(54) POWER SUPPLIER USING FLEXIBLE PCB BASED ON SELF-POWERING AND SENSOR NODE USING THE SAME

(75) Inventors: Sang Choon Ko, Daejeon (KR); Chi Hoon Jun, Daejeon (KR)

(73) Assignee: Electronics & Telecommunications Research Institute, Daejeon (KR)

( * ) Notice: Subject to any disclaimer, the term of this patent is extended or adjusted under 35 U.S.C. 154(b) by 356 days.

(21) Appl. No.: 13/288,988

(22) Filed: Nov. 4, 2011

(65) Prior Publication Data
US 2012/0152028 A1 Jun. 21, 2012

(30) Foreign Application Priority Data
Dec. 16, 2010 (KR) .................. 10-2010-0129038

(51) Int. Cl.
H02N 2/18 (2006.01)

(52) U.S. Cl.
USPC ........................ 310/328; 310/321; 73/146.5

(58) Field of Classification Search
USPC ......... 73/146.5; 310/311, 314, 318, 321, 328, 310/333
See application file for complete search history.

(56) References Cited

U.S. PATENT DOCUMENTS

| | | | |
|---|---|---|---|
| 6,404,107 B1* | 6/2002 | Lazarus et al. | 310/328 |
| 6,909,222 B2* | 6/2005 | Sawada | 310/328 |
| 6,954,025 B2 | 10/2005 | Nishida et al. | |
| 7,260,984 B2 | 8/2007 | Roundy et al. | |
| 8,113,059 B2* | 2/2012 | Buck et al. | 73/753 |
| 2004/0130831 A1 | 7/2004 | Kuwajima et al. | |
| 2009/0211353 A1* | 8/2009 | Gao et al. | 73/146.5 |
| 2009/0322187 A1* | 12/2009 | Bibl et al. | 310/366 |
| 2012/0240672 A1* | 9/2012 | Frey et al. | 73/146.5 |
| 2012/0255349 A1* | 10/2012 | Pop et al. | 73/146.5 |
| 2013/0002095 A1* | 1/2013 | Van Der Linden | 310/340 |

FOREIGN PATENT DOCUMENTS

KR 10-2010-0070846 A 6/2010

OTHER PUBLICATIONS

M. Rezaei, J. Lueke, Don Raboud, and W. Moussa, "Challenges in fabrication and testing of piezoelectric MEMS with a particular focus on energy harvesters," Microsyst Technol (2013) 19:1195-1219.*
D. D Benfield, E. Lou, and W. A. Moussa, "A packaging solution utilizing adhesive-filled TSVs and flip-chip methods," J. Micromech. Microeng. 22 (2013) 1-9.*
F. Lu, H. P. Lee, and S. P. Lim, "Modeling and analysis of micro piezoelectric power generatos for micro-electromechnical-systems applications," Smart Mater. Struct. 13 (2004) 57-63.*
Y. Chiu, R. P. Baragayo, H.-C. Hong, "Stacked electret energy harvesting system fabricated with folded flexible printed circuit board," PowerMEMS 2012, Atlanta, GA, USA, Dec. 2-5, 2012 pp. 149-152.*
S. B. Horowitz et al., "A MEMS Acoustic Energy Harvester", Journal of Micromechanics and Microengineering, vol. 16, pp. S174-S181, Aug. 9, 2006.
Marco Ferrari et al., "Piezoelectric Multifrequency Energy Converter for Power Harvesting in Autonomous Microsystems", Sensors and Actuators A, vol. 142, pp. 329-335. Aug. 17, 2007.

* cited by examiner

*Primary Examiner* — Lisa Caputo
*Assistant Examiner* — Punam Roy
(74) *Attorney, Agent, or Firm* — Rabin & Berdo, P.C.

(57) ABSTRACT

Disclosed are a slim self-powering power supplier using a flexible PCB for a wireless sensor network and a sensor node using the same, and a fabrication method thereof. An exemplary embodiment of the present disclosure provides a self-powering power supplier including: a flexible PCB; a lower electrode positioned on the flexible PCB; a piezoelectric body having a cantilever structure deposited on the lower electrode; and an upper electrode formed on the piezoelectric body.

17 Claims, 11 Drawing Sheets

FLOW OF AIR

Fig 6

POWER SUPPLIER USING FLEXIBLE PCB BASED ON SELF-POWERING AND SENSOR NODE USING THE SAME

CROSS-REFERENCE TO RELATED APPLICATIONS

This application is based on and claims priority from Korean Patent Application No. 10-2010-0129038, filed on Dec. 16, 2010, with the Korean Intellectual Property Office, the present disclosure of which is incorporated herein in its entirety by reference.

TECHNICAL FIELD

The present disclosure relates to a slim self-powering power supplier using a flexible PCB for a wireless sensor network and a sensor node using the same, and a fabrication method thereof.

More particularly, the present disclosure a method of fabricating a slim self-powering small-sized piezoelectric generator system by depositing a piezoelectric material by forming a thin metallic plate or a lower electrode of a piezoelectric generating element by a deposition method on a thin and light flexible PCB and soldering other electronic circuit components, and a method of designing and fabricating a power supplier and a sensor node of a wireless sensor network by using the fabricated elements under an environment with vibration or wind and an apparatus using the same.

BACKGROUND

Systems that support a driver to perform safe driving and rapidly perform emergency measures in emergency by providing to the driver information on air pressure in a tire while travelling through diagnosis of a tire condition like a tire pressure monitoring system (TPMS) of a vehicle have been developed to provide a function for acquiring sensor information of various wireless sensor networks in addition to the TPMS. However, since supply power is used up depending on the use of a secondary battery and thereafter, a need for battery replacement through manpower allocation, troublousness and temporal and economical losses are generated at all times. Further, it is very important to select a light element due to problems caused by deposition of piezoelectric materials and an increase in volume in order to improve an output of a piezoelectric power generating element.

As seen in the example of the TPMS, the development of a system which a TPMS module installed in an aluminum wheel in the tire can transmit and receive a target to be determined, that is, information on a space to and from has been extremely required. In addition, in configuring the wireless sensor network, sensor components have been light-weight and small-sized due to the development of MEMS elements that take charge of several functions and as the piezoelectric power generating element that is developed as a substitution for the secondary battery, a bulk piezoelectric body has been currently used. In the future, in addition to the needs for thinning elements, an importance of the technological development to self-supply a power required to operate a sensor has been significantly emphasized. Further, the TPMS which is once mounted on the tire of the vehicle requires a life-span of 10 years or more and in addition, a concern about not the existing battery but an element capable of generating electricity by using a physical quantity of a wire environment, that is, vibration or an air pressure change in the tire has been further heightened.

As a fundamental solution for operating a sensor module without the battery in operating a sensor or actuator module under various environments of various places, the development of a self-powering power generating element has still be left as an assignment and researchers are researching the wind, the sun, and vibrations as energy sources thereof. A system, should be developed, which can provide environments and situational judgment information, which are more helpful to us by supplying energy required for the sensor module adopted in the wireless sensor network based on the physical quantities to further extend operating hours of the sensors.

The tire continuously rotates while travelling and in this case, the piezoelectric power generating element also rotates simultaneously. In this case, in the case of a heavy mass body, the mass body may be inclined to one side by centrifugal force rather than a vertical vibration quantity and the thinning technology of the piezoelectric power generating element is a current technological assignment that the researchers should solve surely.

In the related art, under the background of the research needs, an electricity generating element of a unit element level or an element supplying generated power by arranging a plurality of same elements and research results fabricated in a bulk type are present. Further, in order to complement a demerit in which an output of the unit element level is low, an array type or stack type technology is researched and developed. However, for now, due to a technological problem in which an output power of the power supply element should be further increased, if the volume is continuously increased, there is a very high possibility that a function as a power generating element regardless of the centrifugal force of a rotator will be lost.

SUMMARY

The present disclosure has been made in an effort to fabricate a piezoelectric power generator that ensure durability of an element by using a metal plate in order to acquire reliability under a real tough environment such as vehicle tire by using a piezoelectric material which is excellent in electromechanical conversion efficiency such as lead zirconate titante (PZT) and generates a power of approximately 300 $\mu$W or more which is a load power supply required when a current duty cycle, 1% is used as an operation 'ON'.

The present disclosure has been made in an effort to provide a method that can increase variations of a piezoelectric structure by forming an element structure capable of improving an element output value by transformation by applying force to the piezoelectric power generator from both a center mass body and an edge mass body by using a beam having a torsion bar function as a central axis when a mass body is bonded to the center in order for frequency tuning and an increase in variations of a small-sized piezoelectric power generator and an element on an aluminum wheel in the tire applies acceleration by mechanical vibrations to the element by configuring a piezoelectric power generator having a torsion bar structure through a method of increasing variation to vibration because most vibrations existing in the tire environment is in a low-frequency range of 200 Hz or less.

The present disclosure has been made in an effort to provide an element having a high output power and a high bandwidth, which can serve as a power supply element with respect to a technology in which supplied power is used up depending on the use of a secondary battery and thereafter, thus, troublousness in battery replacement through manpower allocation and temporal and economical losses are generated at all times which is problematic in a slim self-powering wireless sensor network using a vibration source as an electricity generating source such as a TPMS which is a support system allowing a driver to rapidly perform safety driving and an emergency measure in emergency by providing to the driver information on air pressure in a tire while travelling through diagnosis of a tire condition like a tire pressure monitoring system (TPMS) of a vehicle.

The present disclosure has been made in an effort to provide a method that can collect generation of electricity to vibration of a piezoelectric material under an environment with vibration or pressure by configuring a thin piezoelectric material and a thin deposited metallic structure on a flexible printed circuit board (PCB).

The present disclosure has been made in an effort to provide a power supplier having a wider range of sensitive bandwidth by slightly changing the size of mass bodies of four edges, which have different resonance points to be more actively adapted to predetermined generated mechanical vibrations and can be applied to an apparatus requiring a high output by configuring an element array having the resonance point, and can be used as a regular power supply of a sensor module under an operating environment of a wireless sensor network by fabrication to form a micro electricity generating element that reacts sensitively to a wide band of vibration frequency.

An exemplary embodiment of the present disclosure provides a self-powering power supplier including: a flexible PCB; a lower electrode positioned on the flexible PCB; a piezoelectric body having a cantilever structure deposited on the lower electrode; and an upper electrode formed on the piezoelectric body.

Another exemplary embodiment of the present disclosure provides a self-powering sensor node including: a flexible PCB; a lower electrode positioned on the flexible PCB; a piezoelectric body having a cantilever structure deposited on the lower electrode; an upper electrode formed on the piezoelectric body; and a sensor using electricity collected by the upper electrode and the lower electrode as a power.

Yet another exemplary embodiment of the present disclosure provides a method of fabricating a self-powering power supplier including: forming a lower electrode having a cantilever structure on a flexible PCB; depositing a piezoelectric body on the lower electrode; and forming an upper electrode on the piezoelectric body.

Still yet another exemplary embodiment of the present disclosure provides a method of fabricating a self-powering power supplier including: fabricating a piezoelectric element by forming a lower electrode having a cantilever structure, depositing a piezoelectric body on the lower electrode, and forming an upper electrode on the piezoelectric body; and mounting the piezoelectric element on a flexible PCB with electronic circuit components.

According to the exemplary embodiments of the present disclosure, in order to provide a thin and light power supplying element based on a flexible PCB for the purpose of application of a wireless sensor network, vibration while a vehicle travels using a piezoelectric material fabricated by sputtering or screen printing or mechanical vibration under an environment using vibration while travelling or the wind can be used as electrical energy at the time of constructing a wireless sensor network generating electricity by using a vibration variation quantity as a voltage generating source.

In order to acquire a high output power of a piezoelectric power generating element, it is first designed so that variation of a minute mechanical structure with the piezoelectric material is large and it should be designed so that the generated mechanical vibration is well transferred to a mounted bunk piezoelectric body.

According to the exemplary embodiment of the present disclosure, a lower electrode of a piezoelectric power generating element can be directly formed and fabricated on a thin metallic board or flexible board by plating or depositing in order to increase variation and an electricity generation quantity and a center mass body and edge mass bodies pull or push at both sides around a piezoelectric body as if a bowstring is pulled to increase variation depending on vibration. Further, unique resonance frequencies are different from each other by differentiating the sizes of the edge mass bodies, such that multiple resonance points can respond to a predetermined vibration frequency, thereby extending a sensitive bandwidth of the piezoelectric power generating element.

An element that generates a power of approximately 300 μW or more is required as a power generating element which is a load power supply required for a TPMS of a vehicle to transmit information to an RF when a current duty cycle, 1% is used as an operation 'ON' and a self-powering power supplier can be used by configuring the element having the specification.

According to the exemplary embodiments of the present disclosure, in a wireless sensor network system, in particular, electricity is generated and harvested by using a piezoelectric material under an environment such as the wind or mechanical vibration for energy harvesting by using mechanical vibration or the flow of the wind when a light wireless sensor network is required due to sensitivity to a weight, such that troublousness or efforts in replacing the battery is reduced at the time of supplying power to a secondary lithium battery for power supplying to a wireless sensor network required to recognize a predetermined environment or situation in ubiquitous times and an energy source always generated under the environment of the wind or mechanical vibration is generated and charged in a small quantity to be used as energy for transmitting information acquired from sensors of a sensor system wirelessly, such that troublousness in replacing a battery which is used up can be solved at the time of using a secondary battery.

Further, the exemplary embodiments of the present disclosure can be applied to an environment in which mechanical vibration is frequently generated or an environment such as a motor is always rotating while the vehicle moves or travels. In addition, when the volume of piezoelectric power generating elements component is increased and mounted in a rotator in order to acquire a high power, a total weight of all components can be reduced and the piezoelectric power element can be slim by changing a circuit board from an existing thick PCB to a flexible PCB in order to prevent the weight from being problematic.

According to the exemplary embodiments of the present disclosure, it is possible to provide a small-sized batteryless piezoelectricity generating device by using a power supply to be applied in a wireless sensor network system such as a tire pressure monitoring system TPMS that is mounted in a tire to monitor an internal environment in the tire when the vehicle travels as a substitution for a secondary lithium ion battery of a wireless sensor network via mechanical vibration of an external environment.

In particular, in the case of inventing a small-sized power generating device for the TPMS that can supply power instead of an existing battery in operating a system with air pressure variation, temperature, and acceleration sensors in the tire, such as the vehicle tire pressure monitoring system (TPMS), rotational force is strongly restricted due to too heavy generation components, and as a result, there is a very high risk that a function of a small-sized generator intended by a manufacturer will be lost. Therefore, vibration when a tire surface contacting the surface of a wheel is changed or vertical vibration vertically pressing all tires of the vehicle while the tire rotates should be well transferred to the piezoelectric power generating element while being little influenced by centrifugal force while rotating.

According to the exemplary embodiments of the present disclosure, at the time of installing a sensor module installed in a place under an environment in which predetermined vibration and air pressure variation exist in the tire to monitor an internal condition of the tire in real time, power is generated from variation in vibration or pressure by installing an electricity generating element to be charged and supplied to the sensor module, such that power required for the system is supplied to and self-supplied to the installed sensor module through a small-sized piezoelectric generator by using the vibration or air pressure variation while the vehicle travels without the existing power supplier such as the battery. Therefore, a semi-permanent battery for the TPMS which always provides various information on diagnosis of the internal condition of the tire can be achieved.

According to the exemplary embodiments of the present disclosure, by providing a method for solving a fundamental problem regarding the operation of the sensor module without the battery in operating a sensor or actuator module under various environments of several places, energy required for the module is supplied as a power for a sensor node of the wireless sensor network to further extend operating hours of the sensors, thereby providing a system capable of providing more useful environment and situation judgment information to a user.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
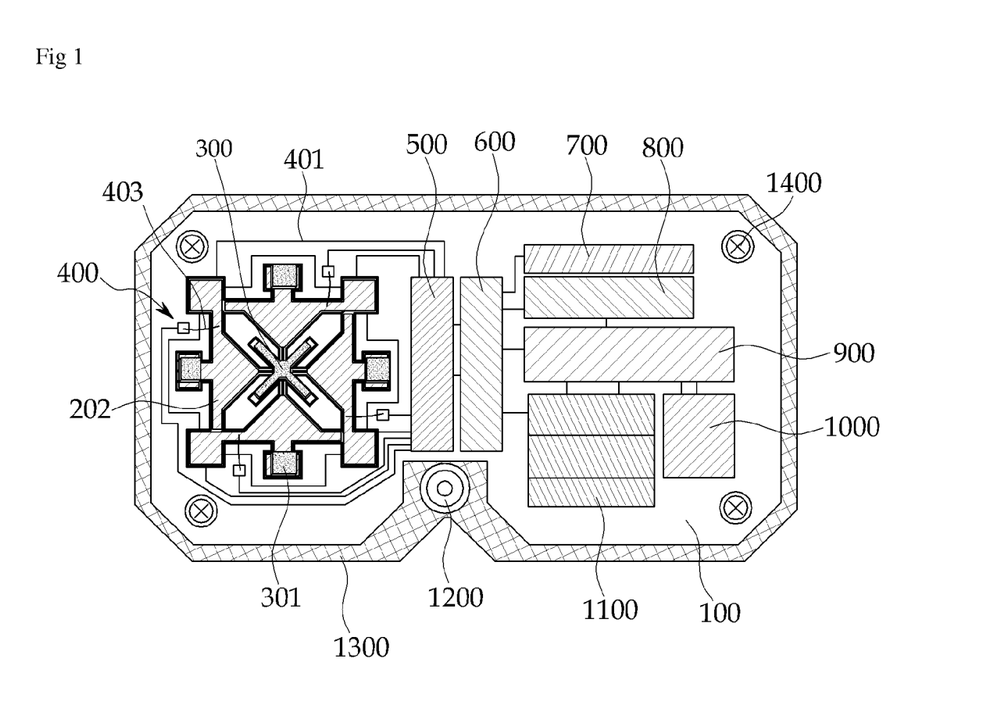
FIG. 1 is a plan view of a wireless sensor system with a piezoelectric power generating element according to an exemplary embodiment of the present disclosure.

FIG. 1 is a plan view of a piezoelectric power generating element and a wireless sensor system mounted on a lower jig according to an exemplary embodiment of the present disclosure and hereinafter, a detailed configuration thereof will be described.

Referring to FIG. 1, an upper electrode pad 400 and a wiring 401 are formed on a flexible PCB 100 as an electrode gold pattern and a piezoelectric power generating element is mounted on flexible PCB 100. The piezoelectric power generating element may have a structure in which a piezoelectric body made of a piezoelectric material is deposited on a lower electrode of a thin metal plate type prepared apart from flexible PCB 100.

In the piezoelectric power generating element, the piezoelectric body is formed by depositing the piezoelectric material on a lower electrode having a cantilever structure serving as a torsion bar, such that the piezoelectric body having the cantilever structure of a torsion bar structure can be formed. The piezoelectric body formed as above is bonded to flexible PCB 100 and fixed to the flexible PCB by aligning a screw fixing flexible PCB hole of flexible PCB 100 with a jig fixing screw 1400, such that the piezoelectric power generating element is mounted in flexible PCB 100.

Both an upper electrode 202 and the lower electrode for collecting electricity of the piezoelectric body are patterned on flexible PCB 100 with the piezoelectric power generating element. Referring to FIG. 1, upper electrode pad 400 is connected with upper electrode 202 of the piezoelectric body and a lower electrode pad is connected with the lower electrode of the piezoelectric body.

A center mass body 300 that is positioned at the center of the piezoelectric power generating element is bonded to the center of upper electrode 202 and an edge mass body 301 positioned at the edge of the piezoelectric power generating element may also be fixed through bonding to upper electrode 202 in the same manner Center mass body 300 and edge mass body 301 may be made of metal. When vibration is generated in the piezoelectric power generating element, center mass body 300 and edge mass body 301 pull or push at the left and the right, such that electricity is generated from the piezoelectric body. Edge mass bodies 301 may have different sizes or masses and thus resonance frequencies of four power generating elements may be different from each other, such that edge mass bodies 301 may have multiple resonance points to sensitively respond to predetermined mechanical vibration. Accordingly, the piezoelectric power generating element may have a wider bandwidth than the piezoelectric element in the related art.

As described above, for example, when vibration or a frequency of air pressure varies actually depending on a traveling velocity of the vehicle, a structure having four cantilevers serving as the torsion bar is formed as a single element by using center mass body 300 and edge mass body 301, such that large variation can be actually caused with respect to four predetermined frequencies. Further, a motion of the piezoelectric element depending on vibration by center mass body 300 and edge mass body 301 becomes bigger to collect piezoelectric electricity generated by the variation.

The wireless sensor system with the piezoelectric power generating element shown in FIG. 1 may be used in the case of using the mechanical vibration as an energy generating source and for example, the wireless sensor system is attached in an environment to acquire the mechanical vibration such as vibration of the vehicle tire while travelling to be used in the tire pressure monitoring system (TPMS) of the vehicle.

FIGS. 2A to 2H are structural cross-sectional diagrams for describing a process of assembling all components of a piezoelectric power generating element and a wireless sensor network system. More specifically, FIGS. 2A to 2H show a fabrication process in which piezoelectric body 200, center mass body 300, and edge mass body 301 are separately fabricated and mounted on the entire system and a process of completing the wireless sensor system by an interbonding process of electronic circuit components including flexible PCB 100.

Figure 2A:
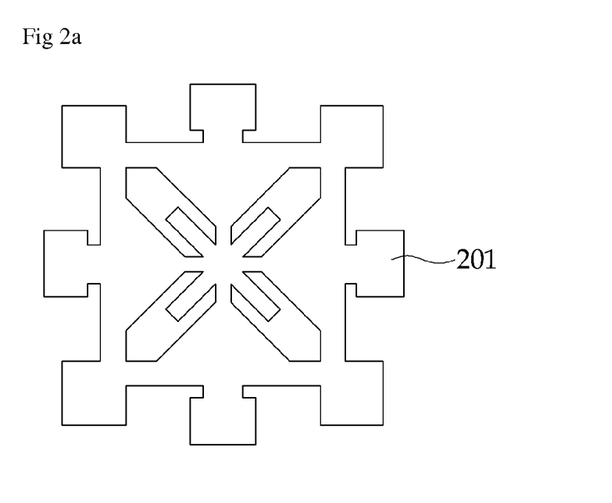
FIGS. 2A to 2H are plan views of a fabrication process of a piezoelectric power generating element and components of a flexible PCB of a wireless sensor system.

In FIG. 2A, a lower electrode 201 is patterned using photolithography and thereafter, etched by wet etching. Lower electrode 201 is constituted by a thin metal plate and for example, may be made of a material such as Invar 42 which is nickel steel. As shown in FIG. 2A, lower electrode 201 for depositing piezoelectric body 200 may be configured to have four cantilever structures serving as the torsion bar.

Figure 2B:
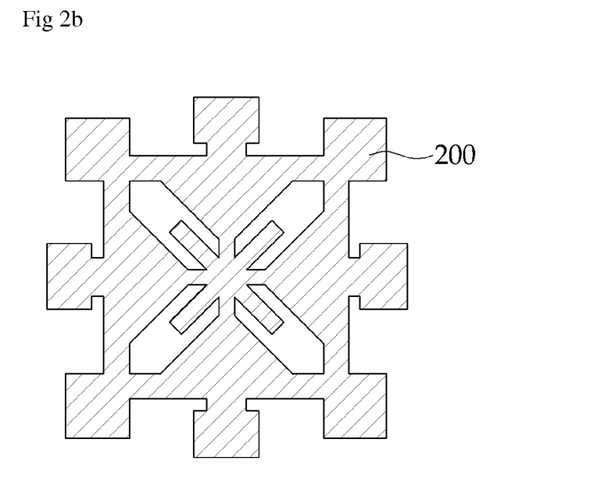

In FIG. 2B, piezoelectric body 200 is deposited on prepared lower electrode 201 by sputtering or screen printing. As shown in FIG. 2B, piezoelectric body 200 has four cantilever structures serving as the torsion bar similarly as lower electrode 201.

Figure 2C:
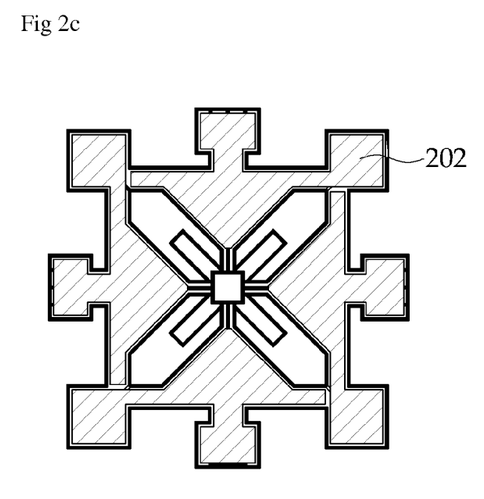

In FIG. 2C, upper electrode 202 is formed on deposited piezoelectric body 200. For example, an electrode pattern is formed on piezoelectric body 200 by using metal for the upper electrode through a stencil mask, such that upper electrode 202 may be formed as shown in FIG. 2C.

Figure 2D:
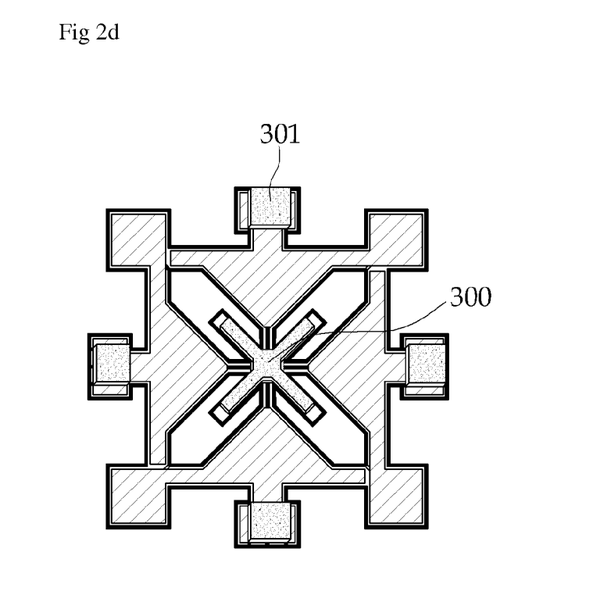

In FIG. 2D, the mass body is attached directly onto upper electrode 202 or center mass body 300 or edge mass body 301 is formed on upper electrode 202 by using the stencil mask. Center mass body 300 is positioned at the center of piezoelectric body 200 and edge mass body 301 may be positioned at each of upper, lower, left and right sides of piezoelectric body 200.

Figure 2E:
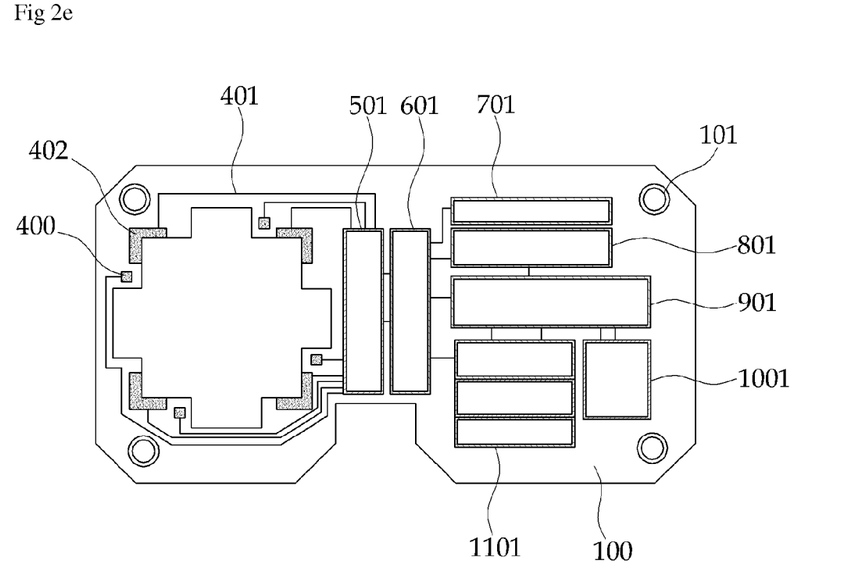

In FIG. 2E, electrodes of the circuit components and lower electrode pad 402 at parts where the piezoelectric elements formed through the processes of FIGS. 2A to 2D are positioned is formed by using flexible PCB 100. When the piezoelectric element is mounted on flexible PCB 100, lower electrode pad 402 may serve as an anchor.

As shown in FIG. 2E, flexible PCB 100 may include a rectifier component pad 501 and a capacitor and regulator pad 601. Further, flexible PCB 100 may include a component pad 701 and a power management circuit pad 801. In addition, flexible PCB 100 may include a circuit component pad 901, an RFID component pad 1001, and a sensor component pad 1101. Besides, screw fixing flexible PCB hole 101 is a hole for inserting a jig screw to couple with a lower wireless sensor system jig 1300.

Figure 2F:
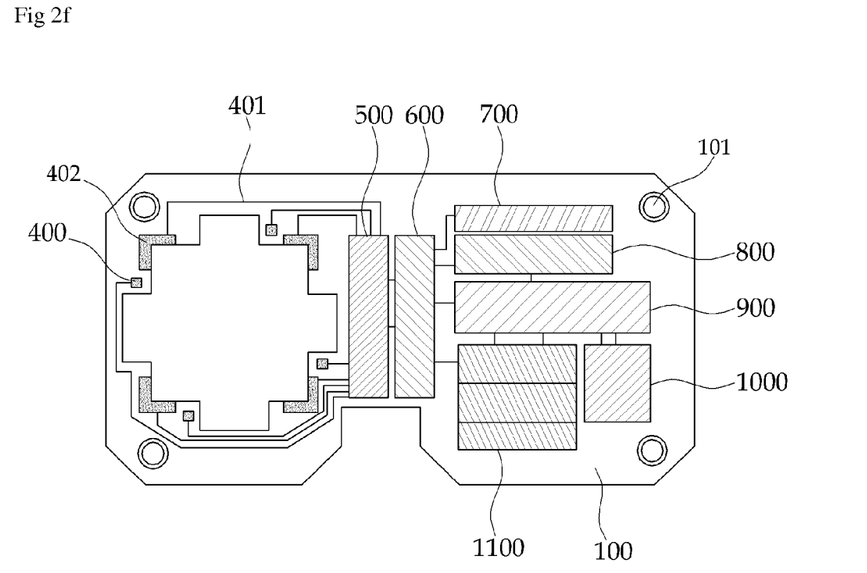

In FIG. 2F, electrode pads of the circuit components and the circuit components are mounted and thereafter, soldered. Rectifier 500 and a storage capacitor and regulator component 600 are mounted on rectifier component pad 501 and a capacitor and regulator pad 601, respectively and a clock oscillator 700 and power management circuit 800 are mounted on component pad 701 and power management circuit pad 801, respectively. Further, a micro-processor, an analog-digital converter, a memory 900, an RFID 1000, and a sensor component 1100 are mounted on circuit component pad 901, RFID component pad 1001, and sensor component pad 1101, respectively.

Figure 2G:
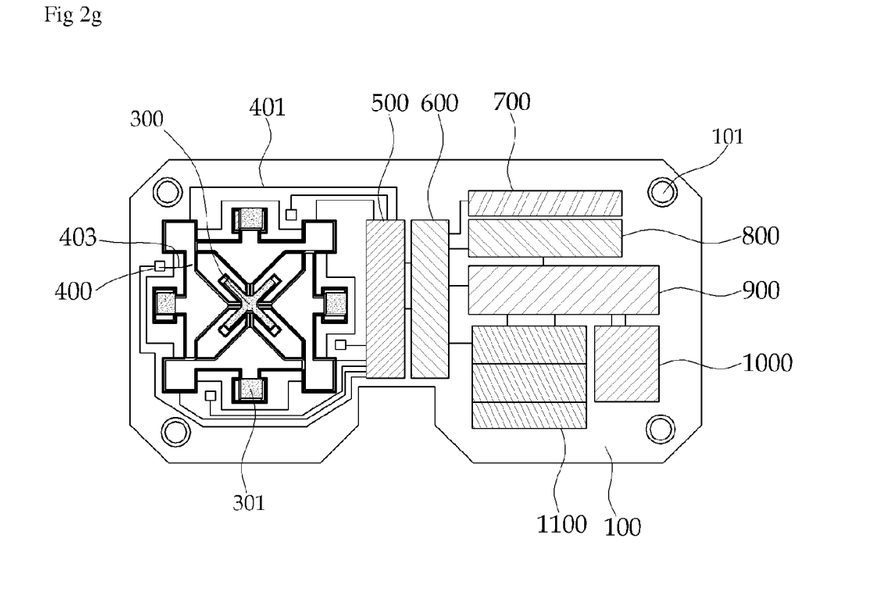

In FIG. 2G, on flexible PCB 100, the electronic circuit components are soldered and thereafter, bonded with the prepared piezoelectric power generating element to be mounted on one board. Referring to FIG. 2G, upper electrode pad 400 of flexible PCB 100 is connected with the piezoelectric element through a connection wire 403.

Figure 2H:
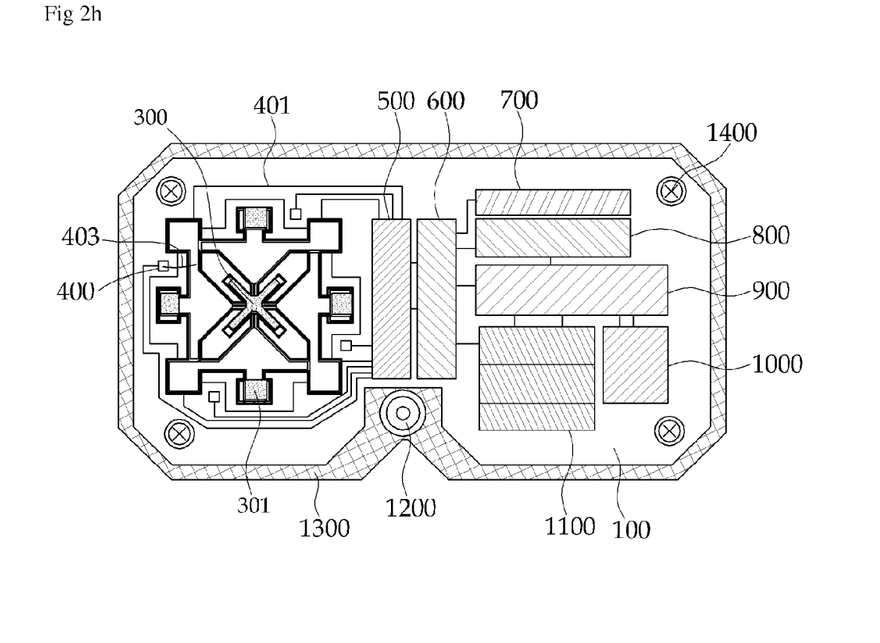

In FIG. 2H, the piezoelectric element and the electronic circuit components are mounted on flexible PCB 100 and thereafter, lower wireless sensor system jig 1300 with an antenna 1200 and flexible PCB 100 are fixed to each other by using jig fixing screw 1400 to be mounted in a case.

FIGS. 3A to 3F are plan views of processes of fabricating a piezoelectric power generating element on one flexible board and assembling all components of a wireless sensor system according to an exemplary embodiment of the present disclosure. In FIGS. 3A to 3F, the piezoelectric elements are fabricated together on flexible PCB 100 unlike FIGS. 2A to 2H.

Figure 3A:
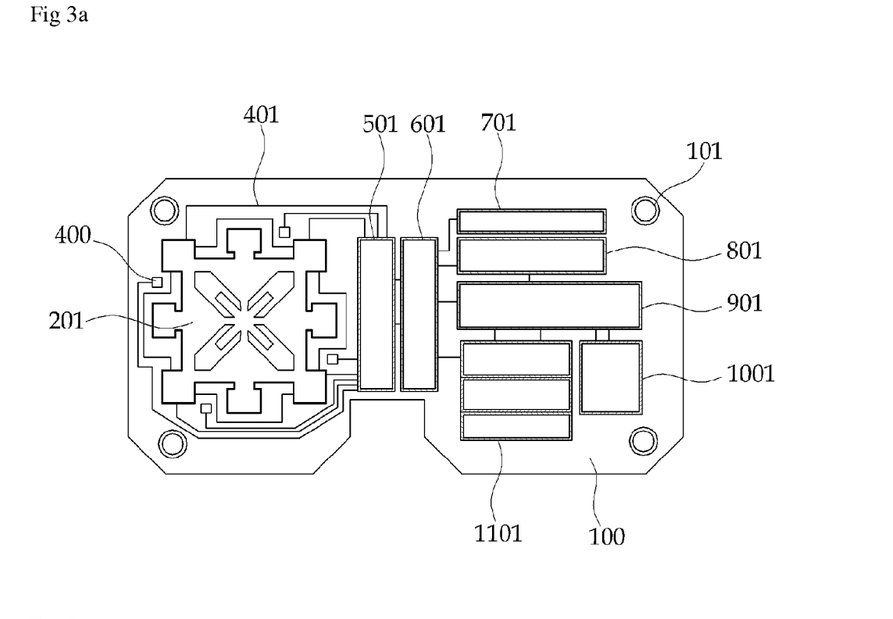
FIGS. 3A to 3F are plan views of fabrication of a piezoelectric power generating element on a flexible PCB and a wireless sensor system mounted on the board according to an exemplary embodiment of the present disclosure.

In FIG. 3A, electrode pads 501, 601, 701, 801, 901, 1001, and 1101 for mounting lower electrode 201 and various electronic circuit components are formed on flexible PCB 100.

Figure 3B:
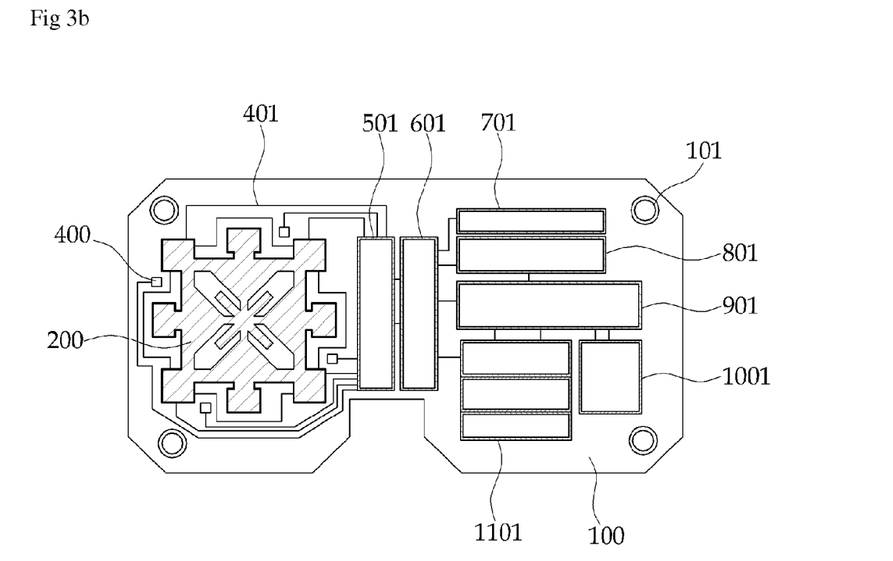

In FIG. 3B, piezoelectric body 200 is deposited on prepared lower electrode 201 through sputtering or screen printing by using the stencil mask.

Figure 3C:
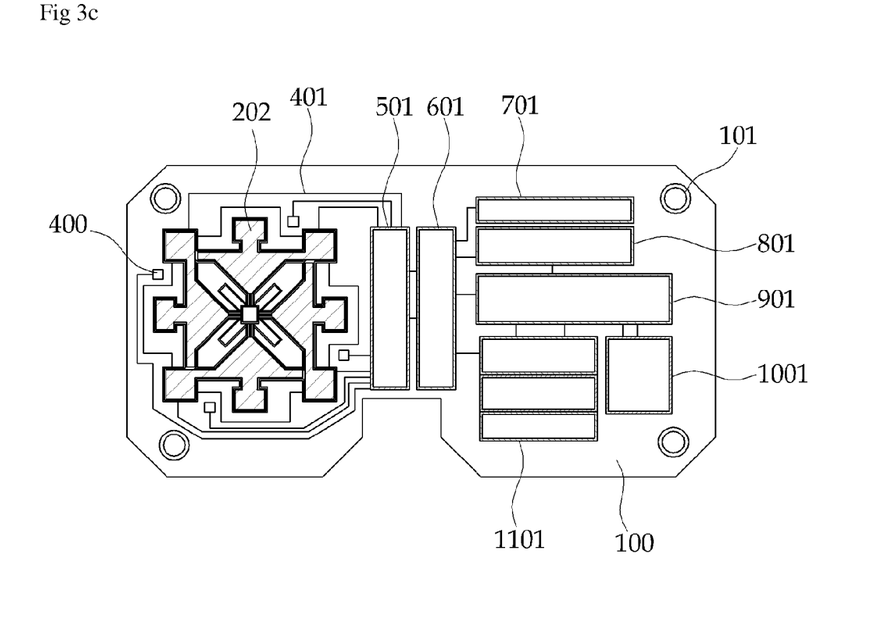

In FIG. 3C, upper electrode 202 is formed by electrode-patterning metal on deposited on deposited piezoelectric body 200 by using the stencil mask.

Figure 3D:
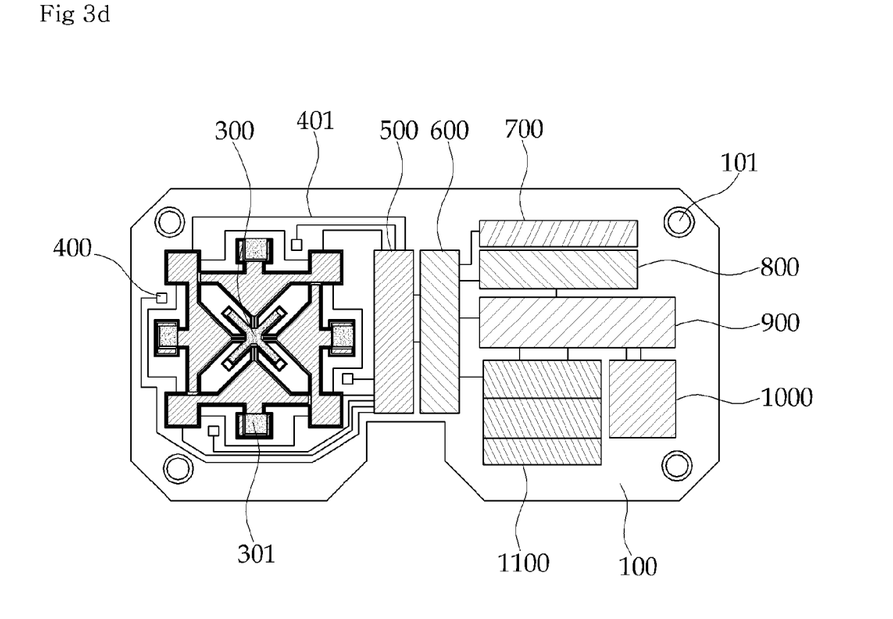

In FIG. 3D, center mass body 300 and edge mass body 301 are formed by attaching the mass body directly onto upper electrode 202 or by using the stencil mask and in addition, various electronic circuit components 500, 600, 700, 800, 800, 1000, and 1100 are mounted on flexible PCB 100 by soldering electrode pads 501, 601, 701, 801, 901, 1001, and 1101.

Figure 3E:
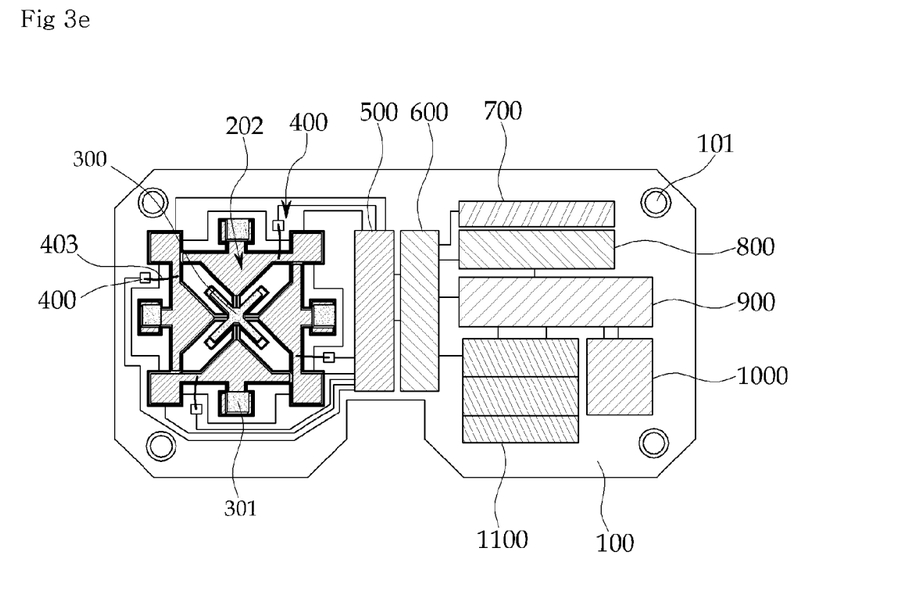

In FIG. 3E, upper electrode 202 of the piezoelectric power generating element and upper electrode pad 400 of flexible PCB 100 are connected to each other through connection wire 403.

Figure 3F:
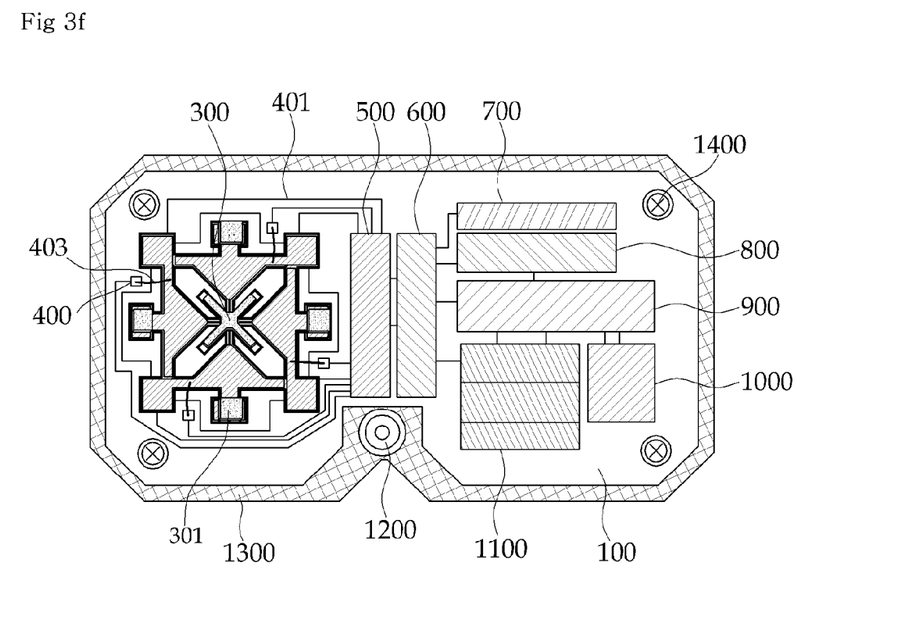

In FIG. 3F, the piezoelectric element and the electronic circuit components are mounted on flexible PCB 100 and thereafter, lower wireless sensor system jig 1300 with antenna 1200 and flexible PCB 100 are fixed to each other by using jig fixing screw 1400 to be mounted in the case.

Figure 4:
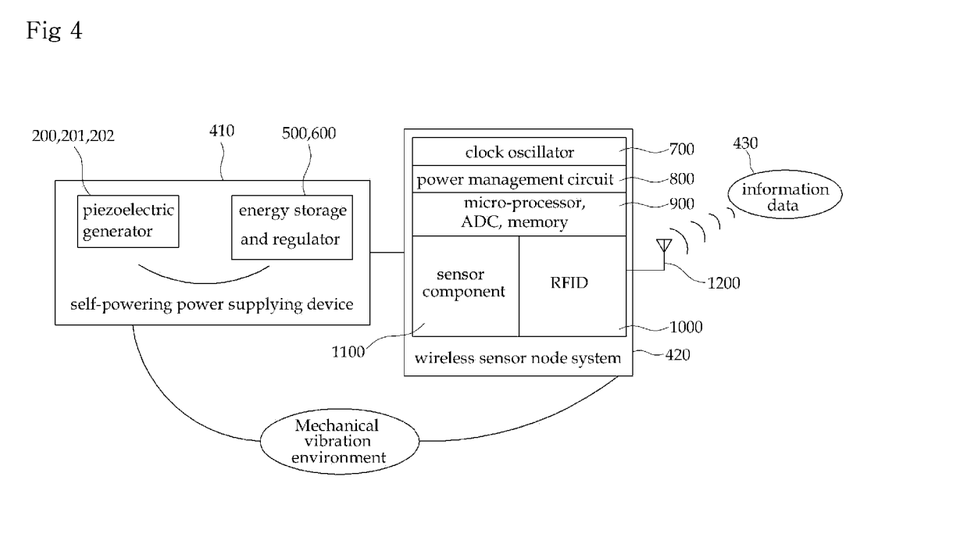
FIG. 4 is a block diagram of a self-powering wireless sensor system according to an exemplary embodiment of the present disclosure.

FIG. 4 is a schematic block diagram of a self-powering wireless sensor network system according to an exemplary embodiment of the present disclosure. FIG. 4 shows one example of application of the wireless sensor network using the fabricated piezoelectric power generating element and the system such as the TPMS may be used as an example.

Referring to FIG. 4, the self-powering wireless sensor network system may be divided into a self-powering power supplying device 410 supplying power using the piezoelectric element and a wireless sensor node system 420 using the power generated from self-powering power supplying device 410.

Self-powering power supplying device 410 includes a piezoelectric power generator including piezoelectric body 200, lower electrode 201, and upper electrode 202 and an energy storage and regulator including rectifier 500 and storage capacitor and regulator component 600.

Wireless sensor node system 420 may include clock oscillator 700, power management circuit 800, the micro-processor, an analog-digital converter ADC, memory 900, RFID 1000, sensor component 1100, and antenna 1200.

Sensor component 1100 may include various kinds of sensors such as an accelerometer, a pressure sensor, and a temperature sensor. Antenna 1200 serves to transmit various information data 430 measured by sensor component 1100 to other devices wirelessly.

The self-powering wireless sensor network system is positioned in a mechanical vibration environment, such that the wireless sensor network system with no battery may be implemented through self-powering power supplying by using the piezoelectric power generating element.

Figure 5:
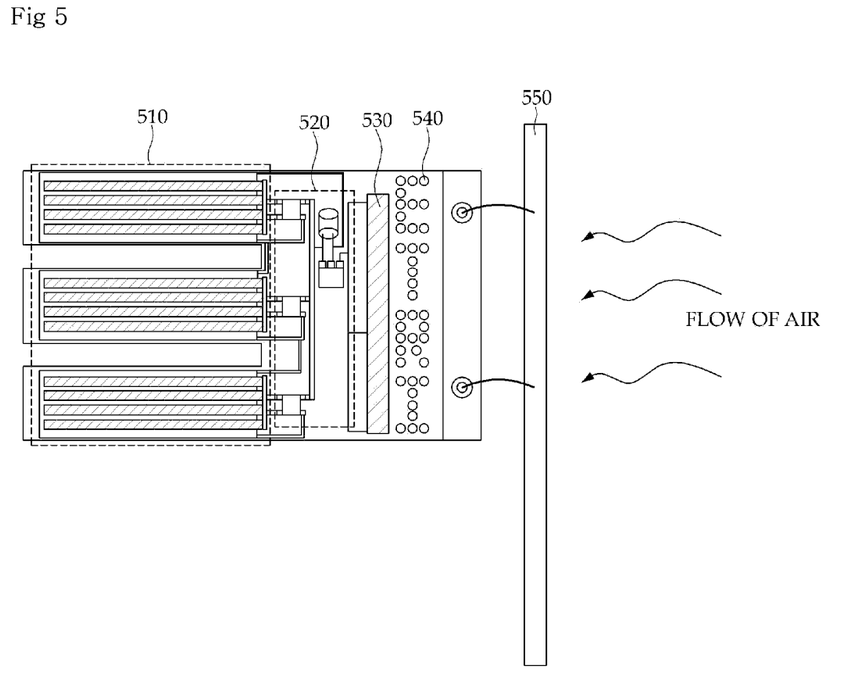
FIG. 5 is an exemplified view of a self-powering LED wireless sensor system based on a flexible PCB using the flow of air according to an exemplary embodiment of the present disclosure.

FIG. 5 is a schematic diagram showing one example of an LED wireless sensor network system including the piezoelectric power generating element fabricated according to an exemplary embodiment of the present disclosure. FIG. 5 shows an example of the system of the present disclosure that stores electricity in the daytime by using the wind by completing a structure which flaps in the wind, such as a flag by using the flexible PCB and performs visually an advertisement while repetitively turning on and off an LED during the night.

Referring to FIG. 5, the self-powering LED wireless sensor network system has the structure such as the flag which flaps under an environment capable of using vibration of the wind such as the flow of air. The self-powering LED wireless sensor network system includes a piezoelectric power generating device 510 generating electric power by using the piezoelectric element, rectifier, storage capacitor, and regulator elements 520, power management, optical sensor, and timing clock circuits 530, an LED 540, and an RF antenna 550.

Figure 6:
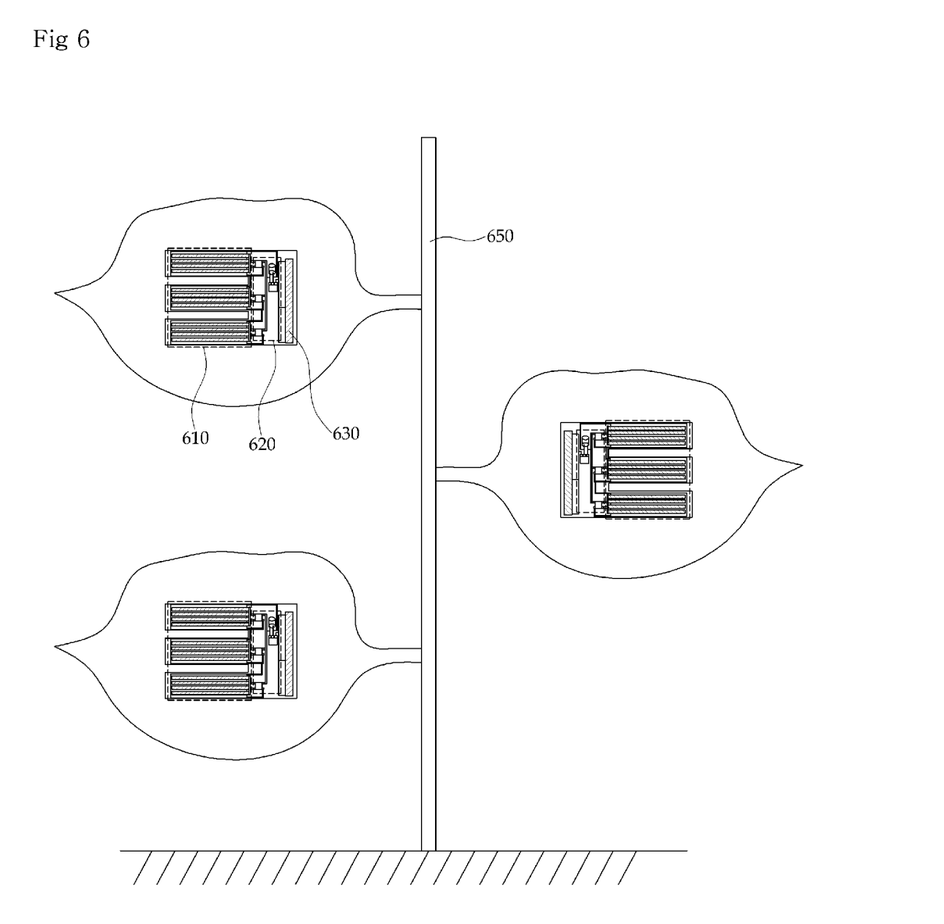
FIG. 6 is an exemplified view of a self-powering environmental monitoring system based on a flexible PCB using the flow of air according to an exemplary embodiment of the present disclosure.

FIG. 6 is a diagram schematically showing a configuration of an environmental monitoring system in which electricity is produced by the wind from a leaf by fabricating a structure having artificial trees such as street trees and artificial leaves and environmental information on a place where the artificial tree is installed every predetermined cycle by mounting temperature, humidity, air flow, and gas sensors on one leaf among them, is acquired to be wirelessly transmitted.

Referring to FIG. 6, electricity is generated from the leaves by motion and vibration of a piezoelectric power generating device 610 by the wind, the electricity is stored in storage capacitor and regulator elements 620, and power management, sensor, and timing clock circuits 530 are driven by using the generated power. Power management, sensor, and timing clock circuits 630 may include, for example, temperature, humidity, gas, and wind speed sensors and acquire environmental information measured by the sensors to transmit the environmental information data to other devices through RF antenna 650 wirelessly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A self-powering power supplier, comprising:
   a flexible PCB;
   a lower electrode positioned on the flexible PCB;
   a piezoelectric body having a cantilever structure deposited on the lower electrode; and
   an upper electrode formed on the piezoelectric body.

2. The self-powering power supplier of claim 1, wherein the lower electrode is minutely patterned by using photolithography and etched by wet etching.

3. The self-powering power supplier of claim 1, wherein the upper electrode is patterned by using a stencil mask.

4. The self-powering power supplier of claim 1, wherein the piezoelectric body is deposited on the lower electrode by using the stencil mask or screen printing.

5. The self-powering power supplier of claim 1, wherein mass bodies are attached to the center and edges of the piezoelectric body.

6. The self-powering power supplier of claim 5, wherein a plurality of resonance points are formed by attaching mass bodies having different sizes or different masses to the edges of the piezoelectric body.

7. The self-powering power supplier of claim 1, wherein the piezoelectric body has a plurality of cantilever structures serving as a torsion bar.

8. The self-powering power supplier of claim 1, wherein electronic circuit components required for controlling a power supplying element is soldered to be formed on the PCB.

9. The self-powering power supplier of claim 1, wherein the self-powering power supplier is attached to a vibration generating device and generates electricity by vibration generated by the vibration generating device.

10. The self-powering power supplier of claim 1, further comprising a rectifier and a voltage regulator.

11. A self-powering sensor node, comprising:
    a flexible PCB;
    a lower electrode positioned on the flexible PCB;
    a piezoelectric body having a cantilever structure deposited on the lower electrode;
    an upper electrode formed on the piezoelectric body; and
    a sensor using electricity collected by the upper electrode and the lower electrode as a power.

12. The self-powering sensor node of claim 11, further comprising an LED using the electricity collected by the upper electrode and the lower electrode as a power.

13. The self-powering sensor node of claim 11, wherein the sensor is a tire pressure monitoring system (TPMS) sensor.

14. The self-powering sensor node of claim 11, wherein the sensor includes at least one of temperature, humidity, gas, and wind speed sensors.

15. The self-powering sensor node of claim 11, further comprising an antenna for transmitting a value measured by the sensor wirelessly.

16. A method of fabricating a self-powering power supplier, comprising:
    forming a lower electrode having a cantilever structure on a flexible PCB;
    depositing a piezoelectric body on the lower electrode; and
    forming an upper electrode on the piezoelectric body.

17. A method of fabricating a self-powering power supplier, comprising:
    fabricating a piezoelectric element by forming a lower electrode having a cantilever structure, depositing a piezoelectric body on the lower electrode, and forming an upper electrode on the piezoelectric body; and
    mounting the piezoelectric element on a flexible PCB with electronic circuit components.

* * * * *